(12) United States Patent
Hong et al.

(10) Patent No.: US 9,048,086 B2
(45) Date of Patent: Jun. 2, 2015

(54) SUBSTRATE RECYCLING METHOD

(71) Applicant: Seoul Viosys Co., Ltd., Ansan-si (KR)

(72) Inventors: Su Youn Hong, Ansan-si (KR); Joo Won Choi, Ansan-si (KR); Jeong Hun Heo, Ansan-si (KR); Su Jin Shin, Ansan-si (KR); Choong Min Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/264,924

(22) Filed: Apr. 29, 2014

(65) Prior Publication Data

US 2014/0322899 A1    Oct. 30, 2014

(30) Foreign Application Priority Data

Apr. 29, 2013    (KR) .......................... 10-2013-0047382

(51) Int. Cl.
*H01L 21/20* (2006.01)
*H01L 21/02* (2006.01)

(52) U.S. Cl.
CPC ............................... *H01L 21/02002* (2013.01)

(58) Field of Classification Search
None
See application file for complete search history.

(56) References Cited

U.S. PATENT DOCUMENTS

2013/0119401 A1*    5/2013    D'Evelyn et al. ............... 257/76

* cited by examiner

*Primary Examiner* — Kyoung Lee
(74) *Attorney, Agent, or Firm* — H.C. Park & Associates, PLC

(57) ABSTRACT

Exemplary embodiments of the present disclosure relate to a substrate recycling method and a recycled substrate. The method includes separating a first surface of a substrate from an epitaxial layer; forming a protective layer on an opposing second surface of the substrate; electrochemically etching the first surface of the substrate; and chemically etching the electrochemically etched first surface of the substrate.

19 Claims, 9 Drawing Sheets

(a)

(b)

SUBSTRATE RECYCLING METHOD

CROSS-REFERENCE TO RELATED APPLICATION

This application claims priority from and the benefit of Korean Patent Application No. 10-2013-0047382, filed on Apr. 29, 2013, which is hereby incorporated by reference for all purposes as if fully set forth herein.

BACKGROUND

1. Field

The present disclosure relates to a substrate recycling method, and more particularly, to a method of recycling a growth substrate separated from a nitride epitaxial layer.

2. Discussion of the Background

A technology of separating a substrate from an epitaxial layer after growing the substrate on the epitaxial layer may be used in the manufacture of light emitting devices. For example, a vertical type gallium nitride-based light emitting diode may be fabricated by growing epitaxial layers including n-type and p-type semiconductor layers on a growth substrate, followed by separating the growth substrate therefrom. Luminous efficacy of the light emitting diode may be improved by attaching a support substrate, which has higher thermal conductivity than the growth substrate, to the epitaxial layers.

In this way, the growth substrate may be used for growth of epitaxial layers and then may be separated from the epitaxial layers after a separate support substrate different from the growth substrate is attached to the epitaxial layers in consideration of operating characteristics of the diode. The growth substrate may be separated from the epitaxial layers by, for example, laser lift-off, chemical lift-off, thermal or mechanical stress lift-off, and the like.

The separated growth substrate may be reused as a substrate for growing another epitaxial layer, thereby reducing substrate manufacturing costs.

In order to reuse the substrate separated from the epitaxial layer, the separated substrate may be subjected to planarization using chemical mechanical polishing. However, since a substrate for growing a gallium nitride-based semiconductor layer or the gallium nitride-based semiconductor layer grown thereon has a very high hardness, it may be difficult to achieve surface planarization through chemical mechanical polishing. As a result, the surface of the substrate subjected to chemical mechanical polishing may include scratches and suffer from cracking.

Moreover, when the gallium nitride-based semiconductor layer remains on an initial substrate used as the growth substrate, the remaining gallium nitride-based semiconductor layer may break when subjected to chemical mechanical polishing, thereby making selection of suitable process conditions difficult.

On the other hand, a technique of completely removing the gallium nitride-based semiconductor layer remaining on the substrate by heating to high temperature may be used. However, removal of the grown gallium nitride-based semiconductor layer through heating may incur high costs and cause damage to a growth substrate, for example, when the growth substrate is a gallium nitride substrate.

SUMMARY

Aspects of the present disclosure provide an improved substrate recycling method.

Aspects of the present disclosure also provide a substrate recycling method without damaging a growth substrate.

Additional features of the present disclosure will be set forth in the description which follows, and in part will be apparent from the description, or may be learned by practice of the disclosure.

In accordance with one aspect of the present disclosure, a substrate recycling method comprises: separating a first surface of a substrate from an epitaxial layer; forming a protective layer on an opposing second surface of the substrate; electrochemically etching the first surface of the substrate; and chemically etching the electrochemically etched surface of the substrate.

The surface of the substrate separated from the epitaxial layer may be flattened using both electrochemical etching and chemical etching, whereby the substrate separated from the epitaxial layer may be used as a substrate for growth of epitaxial layers. In addition, the protective layer is formed on the backside of the substrate, thereby preventing the backside of the substrate from being damaged in the course of electrochemical etching or chemical etching.

The protective layer may comprise a $SiO_2$ layer, Kapton tape, or thermal tape. When the protective layer is a $SiO_2$ layer, the protective layer may be formed to a thickness of 5000 Å to 5 μm. In addition, the protective layer may be further formed to cover a side surface of the substrate. For example, during deposition of $SiO_2$, the side surface of the substrate is exposed to allow $SiO_2$ to be deposited onto the side surface of the substrate. Accordingly, the side surface of the substrate can be protected in the course of electrochemical etching or chemical etching. The protective layer is removed after completion of chemical etching.

The substrate comprising the separated surface may comprise a sacrificial layer on the surface thereof. The sacrificial layer may comprise an n-type gallium nitride-based semiconductor layer. In addition, the substrate comprising the separated surface may further comprise an etch-stop layer disposed under the sacrificial layer. The etch-stop layer may comprise an undoped gallium nitride-based semiconductor layer. Fine voids may be formed in the sacrificial layer by electrochemical etching. Further, the sacrificial layer may be removed by chemical etching, and thereby, the etch-stop layer may be exposed. The etch-stop layer may have a high resistance to electrochemical etching.

The separated surface may comprise protrusions and depressions. The protrusions may be formed in a stripe pattern, an island pattern, or a mesh pattern. The protrusions and the depressions may be formed upon separation of the substrate from the epitaxial layer using chemical lift-off.

The substrate comprising the separated surface may comprise a growth substrate. The growth substrate may be a substrate for growing a gallium nitride-based semiconductor layer, and may comprise a sapphire substrate or a gallium nitride substrate.

The electrochemical etching may be performed using an oxalic acid solution and applying a voltage of 20V to 60V. Further, the chemical etching may be performed using a solution containing NaOH or KOH.

In accordance with another aspect of the present disclosure, a substrate recycling method comprises: preparing a substrate comprising a surface; etching the surface of the substrate by electrochemical etching; and etching the electrochemically etched surface of the substrate by chemical etching.

The smooth surface regions may be arranged in a stripe pattern, an island pattern, or a mesh pattern.

Furthermore, the surface of the substrate may be a surface of an n-type gallium nitride-based semiconductor layer. In addition, the substrate may further comprise an undoped gallium nitride-based semiconductor layer under the n-type gallium nitride-based semiconductor layer.

In accordance with a further aspect of the present disclosure, a substrate recycling method comprises: preparing a substrate comprising an n-type gallium nitride-based semiconductor layer formed on an upper portion of a front side thereof; forming a protective layer on a backside of the substrate; etching the n-type gallium nitride-based semiconductor layer by electrochemical etching; and etching the electrochemically etched n-type gallium nitride-based semiconductor layer by chemical etching.

The substrate may further comprise an undoped gallium nitride-based semiconductor layer disposed under the n-type gallium nitride-based semiconductor layer, and the undoped gallium nitride-based semiconductor layer is exposed by the chemical etching.

The undoped gallium nitride-based semiconductor layer may act as an etch-stop layer relative to electrochemical etching in the course of etching the n-type gallium nitride-based semiconductor layer by electrochemical etching. As a result, it is possible to prevent a surface of a growth substrate under the undoped gallium nitride-based semiconductor layer from being damaged by electrochemical etching or chemical etching.

The n-type gallium nitride-based semiconductor layer may comprise smooth surface regions and rough surface regions. Here, the smooth surface regions may protrude above the rough surface regions.

The protective layer may be formed to cover a side surface of the substrate. In addition, the protective layer may be formed of $SiO_2$, Kapton tape, or thermal tape.

It is to be understood that both the foregoing general description and the following detailed description are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate exemplary embodiments, and together with the description serve to explain the principles of the present disclosure.

DETAILED DESCRIPTION OF THE EXEMPLARY EMBODIMENTS

Figure 1:
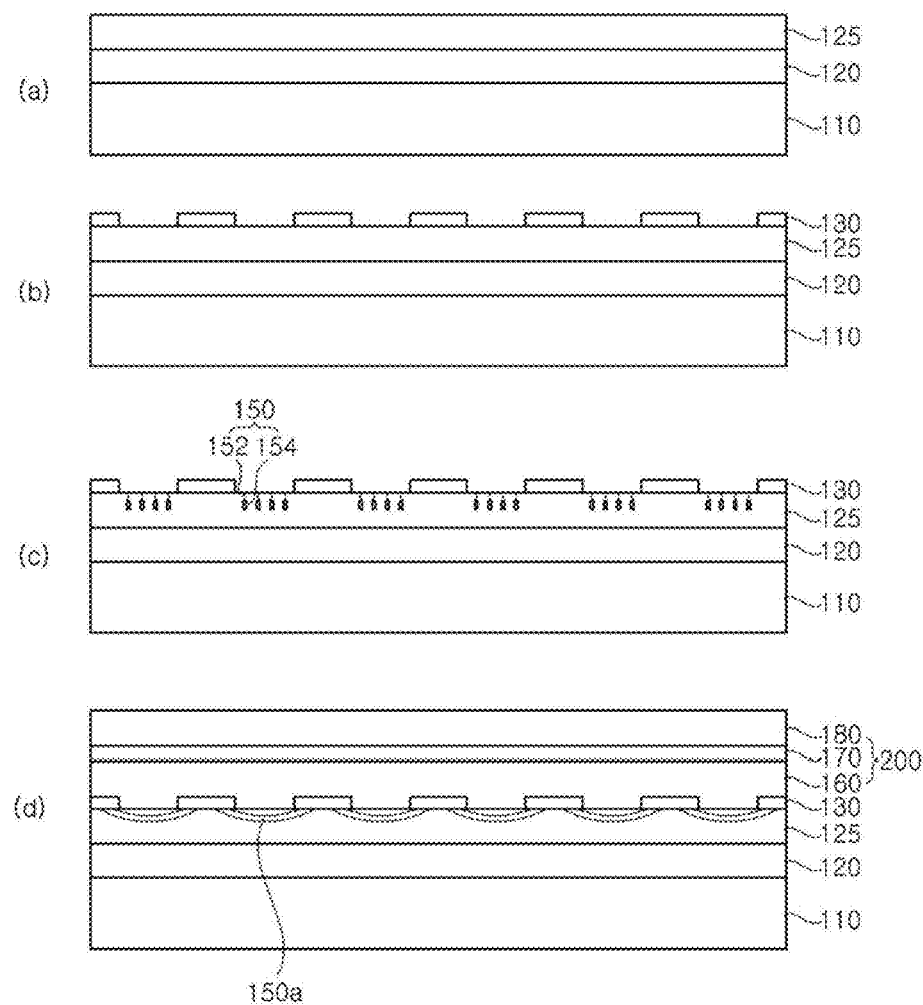
FIGS. 1a, 1b, 1c, d, 2a, 2b, 2c, 2d, 3a, 3b, 3c, and 3d are sectional views illustrating a method of fabricating a light emitting diode using a method of separating a growth substrate in accordance with an exemplary embodiment of the present disclosure.

Exemplary embodiments of the present disclosure will be described in more detail with reference to the accompanying drawings. It should be understood that the following embodiments are given by way of illustration only to provide thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Exemplary embodiments of the present disclosure comprise the provision of a separated substrate by growing nitride semiconductor layers (epitaxial layers) on a growth substrate, followed by separating the growth substrate from the epitaxial layers. The epitaxial layers separated from the growth substrate may be used to fabricate a semiconductor device such as a light emitting diode. Herein, a technology of fabricating a light emitting diode by separating a growth substrate will first be introduced, and then, a method of recycling the separated substrate will be described.

Method of Fabricating Light Emitting Diode

Figure 2:
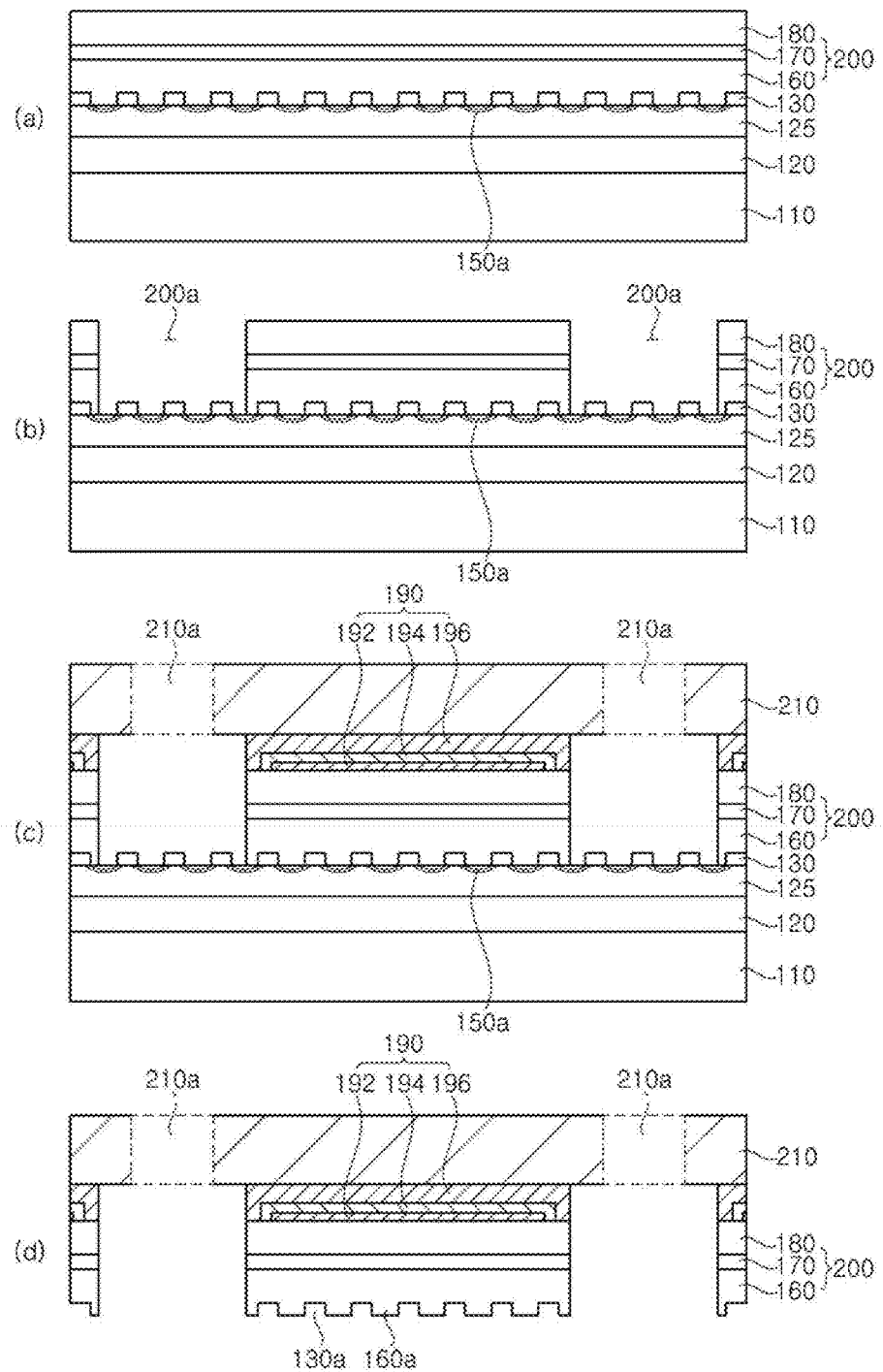
Figure 3:
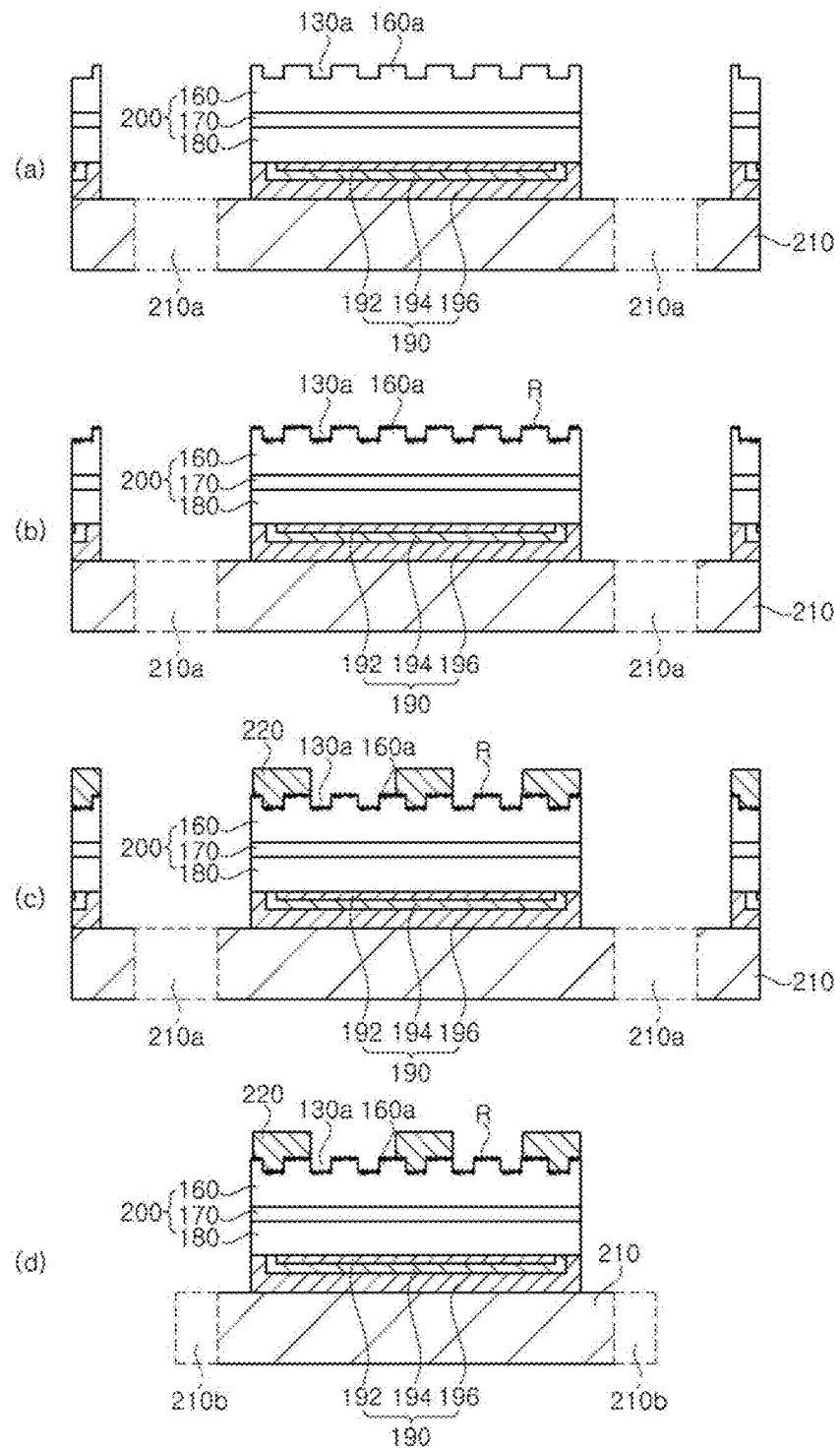

FIGS. 1 to 3 are sectional views illustrating a method of fabricating a light emitting diode using a method of separating a growth substrate, in accordance with an exemplary embodiment of the present disclosure.

First, referring to FIG. 1(a), a growth substrate 110 is prepared. The growth substrate 110 may be a sapphire substrate, a GaN substrate, a silicon carbide (SiC) substrate, or a silicon (Si) substrate. Particularly, the growth substrate 110 may be a sapphire substrate or a GaN substrate, and may be polar, non-polar or semi-polar.

An etch-stop layer 120 and a sacrificial layer 125 may be formed on the growth substrate 110. The etch-stop layer 120 may comprise an undoped gallium nitride-based semiconductor layer, for example, an undoped GaN layer, and the sacrificial layer 125 may comprise an n-type gallium nitride-based semiconductor layer 120. The undoped gallium nitride-based semiconductor layer 120 and the n-type gallium nitride-based semiconductor layer 125 may be grown on the growth substrate 110 by metal organic chemical vapor deposition (MOCVD), molecular beam epitaxy (MBE), and the like. The undoped gallium nitride-based semiconductor layer 120 is grown without intentional impurity doping, and the n-type gallium nitride-based semiconductor layer 125 may be formed of a gallium nitride-based layer, for example, a GaN layer, which has a relatively high impurity concentration, for example, $1E17 \sim 1E19/cm^3$ of Si. Like the undoped gallium nitride-based semiconductor layer 120 and the n-type gallium nitride-based semiconductor layer 125, nitride-based semiconductor layers described below may be grown by MOCVD or MBE, and detailed descriptions thereof will be omitted.

Figure 4:
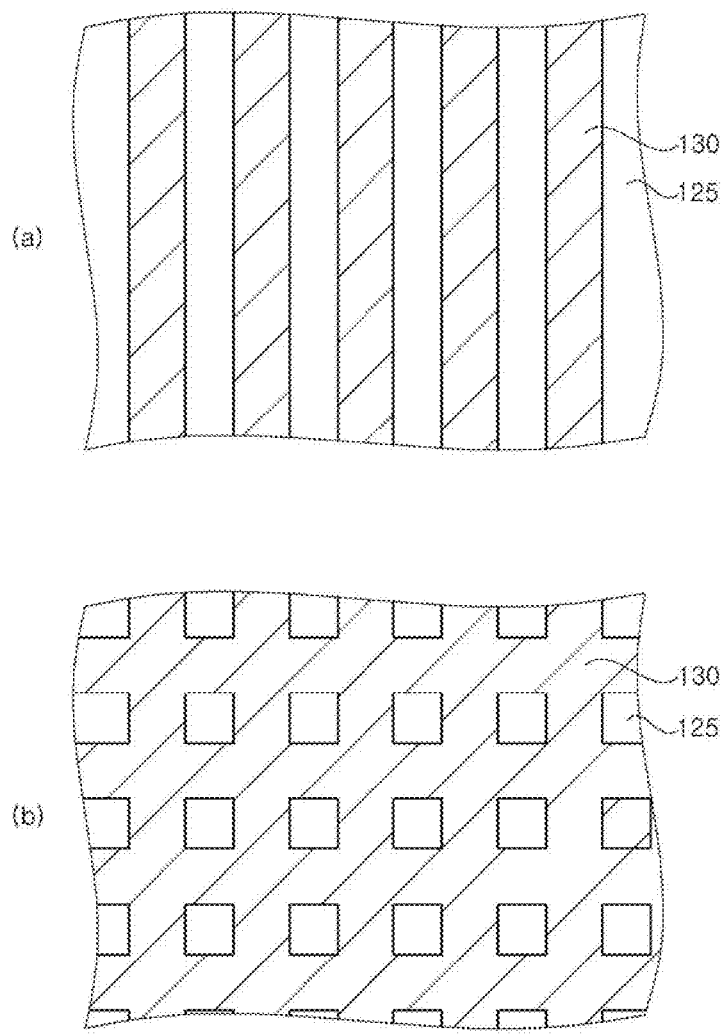
FIGS. 4a, 4b, 5a, 5b, 6a, and 6b are plan views of mask patterns used for separation of a growth substrate.
Figure 5:
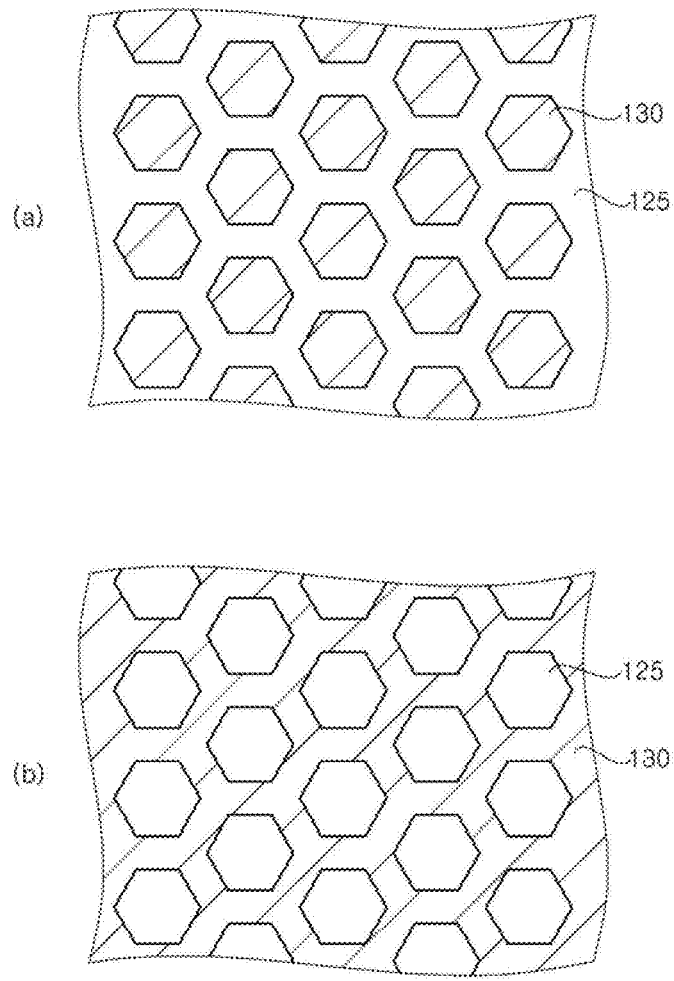
Figure 6:
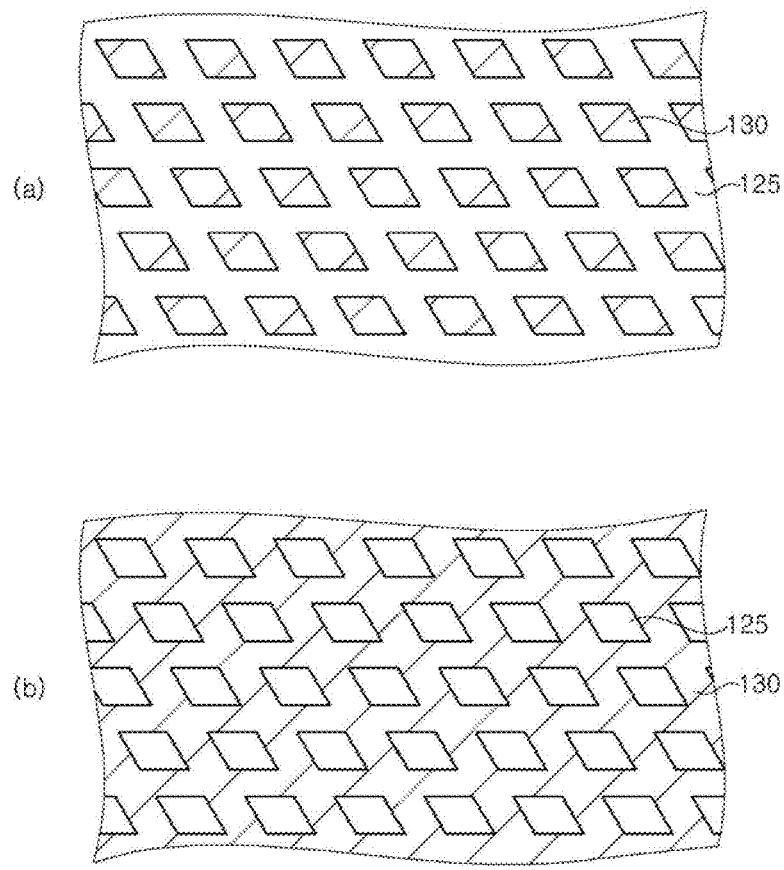

Referring to FIG. 1(b), a mask pattern 130 is formed on the sacrificial layer 125. The mask pattern 130 may be formed to have a thickness of about 5 nm to about 10 μm of, for example, SiN or SiO$_2$. In the mask pattern 130, each masking region may be formed in a stripe shape as shown in FIG. 4(a), or may be formed as stripes extending in different directions and intersecting each other, as shown in FIG. 4(b). Alternatively, the mask pattern 130 may be a pattern of concave shapes, in which the masking regions have a hexagonal shape as shown in FIG. 5(a), or in which the masking regions have a rhombus shape as shown in FIG. 6(a). Alternatively, the mask pattern 130 may be a pattern of convex shapes, in which opening regions have a hexagonal shape as shown in FIG. 5(b), or in which the opening regions have a rhombus shape as shown in FIG. 6(b). The mask pattern 130 may be a pattern of convex shapes, in which the masking regions have a circular shape, or a pattern of concave shapes, in which the opening regions have a circular shape. The mask pattern 130 may have a regular pattern size ranging from about 5 nm to about 20 μm.

Referring to FIG. 1(c), fine voids 150 are formed in the sacrificial layer 125 by partially etching the sacrificial layer 125 through electrochemical etching (ECE).

For electrochemical etching, the growth substrate 110 comprising the sacrificial layer 125, formed thereon and a cathode (for example, Pt electrode) are dipped in an ECE solution, and positive voltage is applied to the sacrificial layer 125 while applying negative voltage to the cathode. Here, the size of the fine voids 150 may be controlled by adjusting a molar concentration of the ECE solution, processing time, and applied voltage.

The ECE solution may be an electrolyte solution, for example, an electrolyte solution including oxalic acid, HF, or NaOH.

In the present exemplary embodiment, the sacrificial layer 125 may be partially etched by single stage electrochemical etching, in which a constant voltage, for example, a voltage of 10V to 60V, is continuously applied thereto. Alternatively, the sacrificial layer 125 may be partially etched by two-stage electrochemical etching, in which a relatively low voltage is initially applied in a first stage, and a relatively high voltage is applied in a second stage. FIG. 1(c) shows fine voids 152, 154 which are formed by two-stage electrochemical etching, in which fine voids 152 comprising a relatively small size are formed in the first stage by applying a relatively low voltage, and fine voids 154 comprising relatively large size are formed in the second stage by applying a relatively high voltage. For example, the n-type gallium nitride-based semiconductor layer 125 comprising a Si concentration of 6E18/cm$^3$ may be subjected to electrochemical etching using an oxalic acid solution at 20° C., by applying a voltage of 8V to 9V in a first stage, and applying a voltage of 15V to 17V in a second stage.

With the two-stage electrochemical etching, the surface of the n-type gallium nitride-based semiconductor layer 125 can maintain relatively good crystallinity, and relatively large fine voids 154 can be formed in the n-type gallium nitride-based semiconductor layer 125, thereby facilitating a subsequent process.

Referring to FIG. 1(d), the n-type gallium nitride-based semiconductor layer 125 may be used as a seed to grow a nitride semiconductor stack structure 200 comprising epitaxial layers such as a first nitride semiconductor layer 160, an active layer 170, a second nitride semiconductor layer 180, and the like. The nitride semiconductor stack structure 200 is formed to cover the sacrificial layer 125 and also the mask pattern 130 through lateral growth.

The first nitride semiconductor layer 160 may be a single layer. Alternatively, the first nitride semiconductor layer 160 may be formed as multiple layers. Such multiple layers may comprise an undoped layer and a doping layer.

On the other hand, during growth of the semiconductor stack structure 200, the fine voids 152, 154 grow together to form voids 150a. The voids 150a are formed to connect adjacent masking regions of the mask pattern 130 to each other. In FIG. 1(d), an interface is shown as remaining between the sacrificial layer 125 and the first nitride semiconductor layer 160. However, it should be understood that the voids 150a may become the interface between the sacrificial layer 125 and the first nitride semiconductor layer 160.

Referring to FIG. 2(a), the nitride semiconductor stack structure 200, comprising the first nitride semiconductor layer 160, the active layer 170 and the second nitride semiconductor layer 180, is formed on the sacrificial layer 125. As described above, during formation of the semiconductor stack structure 200, the voids 150a are formed in the n-type gallium nitride-based semiconductor layer 125 by the fine voids 152, 154 in the sacrificial layer 125. Here, FIG. 2(a) shows the same process as in FIG. 1(d), at a different scale.

The first nitride semiconductor layer 160 may be formed of III-N based compound semiconductor doped with a first conductive type impurity. For example, the first nitride semiconductor layer 160 may be formed of a nitride semiconductor, for example, an (Al, In, Ga)N-based nitride semiconductor, which is doped with an n-type impurity, and may comprise a gallium nitride layer. In addition, the first nitride semiconductor layer 160 may comprise an undoped layer, which is not doped with impurities.

The active layer 170 may be formed of a III-N based compound semiconductor, for example, an (Al, Ga, In)N semiconductor, and may have a single quantum well structure, or a multi-quantum well structure in which well layers (not shown) and barrier layers (not shown) are alternately stacked on one another.

The second nitride semiconductor layer 180 may be formed of a III-N based compound semiconductor, for example, an (Al, Ga, In)N-based Group III-nitride semiconductor, doped with a second conductive type impurity, for example, a p-type impurity, and may comprise, for example, a GaN layer.

Referring to FIG. 2(b), a device isolation area 200a may be formed by patterning the nitride semiconductor stack structure 200. The device isolation area 200a may be formed through photolithography and etching. A plurality of nitride semiconductor stack structures 200 that are divided into individual device areas may be formed by the device isolation area 200a.

On the other hand, as shown in the drawings, the sacrificial layer 125 and the mask pattern 130 are exposed by the device isolation area 200a.

Referring to FIG. 2(c), a support substrate 210 is attached to an upper surface of the nitride semiconductor stack structure 200. The support substrate 210 may be bonded to the nitride semiconductor stack structure 200 via a bonding layer 190. The bonding layer 190 may comprise, for example, a reflective metal layer 192, a barrier metal layer 194 and a bonding metal layer 196. The barrier metal layer 194 covers the reflective metal layer 192, and the bonding metal layer 196 surrounds the reflective metal layer 192 and the barrier metal layer 194 to protect the reflective metal layer 192 and the barrier metal layer 194 from an etching solution. The reflective metal layer 192 is electrically connected to the second nitride semiconductor layer 180.

In the present exemplary embodiment, the bonding layer 190 is formed after formation of the device isolation area 200a. Alternatively, the reflective metal layer 192, and the barrier metal layer 194 may be formed before formation of the device isolation area 200a. In addition, the bonding metal layer 196 may be formed before formation of the device isolation area 200a.

The support substrate 210 may comprise through-holes 210a, as shown in FIG. 2(c). Although not particularly limited, these through-holes 210a may be aligned within the device isolation area 200a. For example, the through-holes 210a may be disposed near four corners of the nitride semiconductor stack structure 200 disposed in a single device area, respectively. The through-holes 210a facilitate the permeation of the etching solution into the device isolation area 200a during chemical etching for chemical lift-off (CLO), thereby reducing a time for separation of the growth substrate 110.

Referring again to FIG. 2(c), the support substrate 210 may be a sapphire substrate, a GaN substrate, a glass substrate, a silicon carbide substrate, or a silicon substrate. Alternatively, the support substrate 210 may be a conductive substrate including metallic materials, a circuit substrate such as a printed circuit board (PCB) or the like, or a ceramic substrate.

In addition, a bonding metal layer (not shown) may be provided on the support substrate 210, so as to correspond to the bonding metal layer 196. As such, the support substrate 210 can be attached to the nitride semiconductor stack structure 200 through eutectic bonding between the bonding metal layer of the support substrate 210 and the bonding metal layer 196 of the nitride semiconductor stack structure 200.

Referring to FIG. 2(d), after the support substrate 210 is attached to the nitride semiconductor stack structure 200, the growth substrate 110 is separated from the semiconductor stack structure 200 by chemical etching using an etching solution, which contains, for example, NaOH, BOE, HF, or the like. The etching solution etches the mask pattern 130 or GaN at the interface between the mask pattern 130 and the nitride semiconductor stack structure 200 to separate the growth substrate 110 from the nitride semiconductor stack structure 200. After separation of the growth substrate 110, the etch-stop layer 120 and the sacrificial layer 125 can remain on the growth substrate 110, which will be described in more detail with reference to FIG. 7.

As the mask pattern 130 is removed, a concave-convex structure comprising depression regions 130a and protrusion regions 160a are formed on the surface of the nitride semiconductor stack structure 200, particularly, on the surface of the first nitride semiconductor layer 160.

In the present exemplary embodiment, the growth substrate 110 is separated from the nitride semiconductor stack structure 200 by chemical etching. However, the growth substrate 110 may be separated from the nitride semiconductor stack structure 200 by application of physical stress. For example, after the plurality of voids 150a is formed, the growth substrate 110 may be separated from the nitride semiconductor stack structure 200 by applying stress to the mask pattern 130.

FIG. 3(a) shows the separated growth substrate 110 rotated from as shown in FIG. 2(d). Referring to FIG. 3(a), after separation of the growth substrate 110, the surface of the growth substrate 110 may be subjected to cleaning using hydrochloric acid or the like to remove Ga droplets therefrom. In addition, part of the nitride semiconductor stack structure 200 may be removed by dry etching in order to remove a high resistance nitride semiconductor layer remaining on the surface thereof.

Referring to FIG. 3(b), surface roughness R may be formed on the surface of the nitride semiconductor stack structure 200, by photoelectric chemical (PEC) etching or the like. The surface roughness R is formed on bottom surfaces of the depression regions 130a and upper surfaces of the protrusion regions 160a. By forming the surface roughness R in addition to the depression regions 130a and the protrusion regions 160a, the light emitting device may have improved efficiency in extraction of light generated from the active layer 170.

Referring to FIG. 3(c), an electrode 220 is formed on the nitride semiconductor stack structure 200. The electrode 220 may comprise an electrode pad to which a wire may be connected, and an extension leg extending from the electrode pad. The electrode 220 is electrically connected to the first nitride semiconductor layer 160. When the support substrate 210 is a conductive substrate, the support substrate 210 is electrically connected to the second nitride semiconductor layer 180 to act as an electrode, or a separate electrode pad may be formed under the support substrate 210. When the support substrate 210 is an insulating substrate, the bonding layer 190 may extend outside to form an electrode pad.

Before or after formation of the electrode 220, an insulating layer (not shown) may be additionally formed to cover the nitride semiconductor stack structure 200.

Referring to FIG. 3(d), the support substrate 210 is divided into individual devices, thereby completing light emitting diodes. The support substrate 210 may be divided by scribing along the device isolation area 200a.

According to the present exemplary embodiment, the growth substrate 110 can be separated without damaging the nitride semiconductor stack structure 200. Furthermore, since the growth substrate 110 is separated using the voids 150a formed between the growth substrate 110 and the semiconductor stack structure 200, it may be possible to separate the growth substrate 110 through application of physical stress or by chemical etching.

Furthermore, since the through-holes 210a are formed together with the device isolation area 200a, the etching solution more rapidly permeates into the device isolation area 200a, thereby enabling further reduction in process time. Further, the separated growth substrate 110 may be reused as a growth substrate.

In the above exemplary embodiments, separation of the growth substrate is performed using chemical lift-off or stress lift-off in manufacture of the light emitting diode. However, other methods such as laser lift-off may also be applied to the substrate separation method.

Substrate Recycling Method

Hereinafter, a substrate recycling method using a substrate separation technology will be described.

Figure 7:
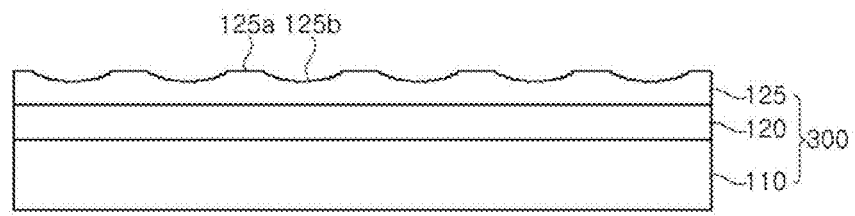
FIG. 7 is a sectional view of a substrate separated from an epitaxial layer.

FIG. 7 is a sectional view of a substrate 300 separated from an epitaxial layer by the method described above, and FIG. 8 is a planar SEM image showing a surface of a substrate separated from an epitaxial layer by chemical lift-off.

Figure 8:
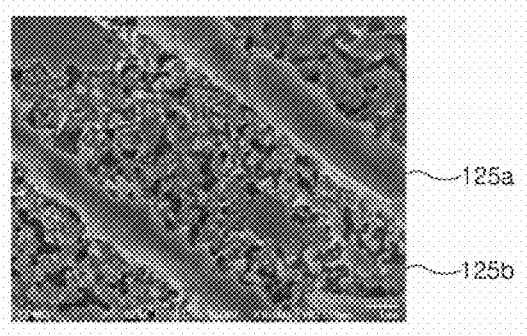
FIG. 8 is a planar SEM image showing a surface of a substrate separated from an epitaxial layer.

Referring to FIG. 7 and FIG. 8, a separated substrate 300 may comprise an etch-stop layer 120 and a sacrificial layer 125. A surface of the separated substrate 300 may comprise protrusions 125a and depressions 125b. Here, the protrusions 125a have smoother surfaces than the depressions 125b. As shown in FIG. 8, the depressions 125b have very rough surfaces. Accordingly, the smooth surfaces protrude above the rough surfaces.

In the present exemplary embodiment, the protrusions 125a correspond to the masking regions of the mask pattern 130, and the depressions 125b correspond to the voids 150a. Thus, the protrusions 125a or the smooth surfaces may be arranged in a regular pattern, for example, a stripe pattern, an island pattern, or a mesh pattern, as in the mask pattern 130. The protrusions 125a and the depressions 125b are formed on the sacrificial layer 125. In addition, the etch-stop layer 120 may be exposed to the depressions 125b.

As described above, the sacrificial layer 125 may comprise an n-type gallium nitride-based semiconductor layer, and the etch-stop layer 120 may comprise an undoped gallium nitride-based semiconductor layer. Accordingly, the separated substrate 300 may comprise the n-type gallium nitride-based semiconductor layer 125 on the surface thereof, and the protrusions 125a and the depressions 125b may be formed on the surface of the n-type gallium nitride-based semiconductor layer 125.

As shown in FIG. 7 and FIG. 8, the separated substrate 300 has a very rough surface, and may comprise the protrusions 125a and the depressions 125b. Such a rough surface may not be formed only by chemical lift-off, but also by other substrate separation technologies such as stress lift-off (SOL) or laser lift-off (LLO). In order to use the substrate comprising a rough surface as a growth substrate, surface planarization may be required.

Hereinafter, a method of recycling a separated substrate will be described in more detail.

Figure 9:
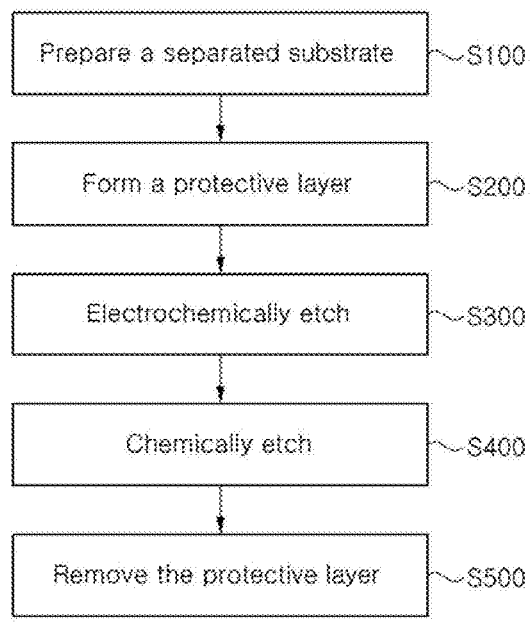
FIG. 9 is a schematic flowchart of a substrate recycling method in accordance with an exemplary embodiment of the present disclosure.
Figure 11:
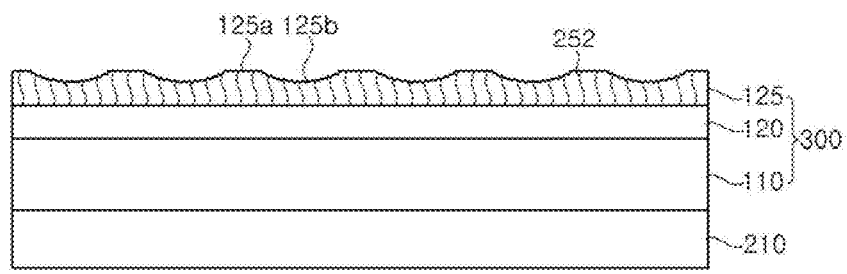
Figure 12:
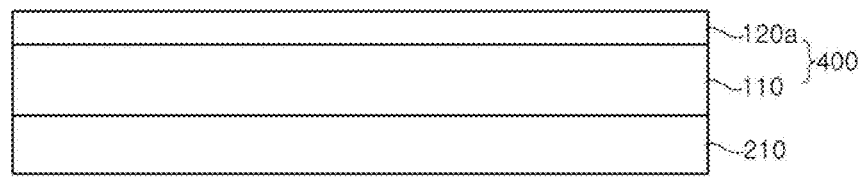

FIG. 9 is a schematic flowchart of a substrate recycling method in accordance with an exemplary embodiment of the present disclosure, and FIGS. 11 and 12 are sectional views illustrating respective operations in the substrate recycling method.

Referring to FIG. 9, a separated substrate 300 as shown in FIG. 7 is prepared (S100). The separated substrate 300 has a surface that has been separated from an epitaxial layer, for example, a semiconductor stack structure 200 at a front side thereof. The separated substrate 300 comprises a growth substrate 110, and may comprise a sacrificial layer 125 and an etch-stop layer 120 disposed under the sacrificial layer 125, as described with reference to FIG. 7. The growth substrate 110 may be a growth substrate for growing a gallium nitride-based semiconductor layer, and may comprise, for example, a sapphire substrate or a gallium nitride substrate. In addition, the growth substrate 110 may comprise a polar, non-polar or semi-polar substrate.

Figure 10:
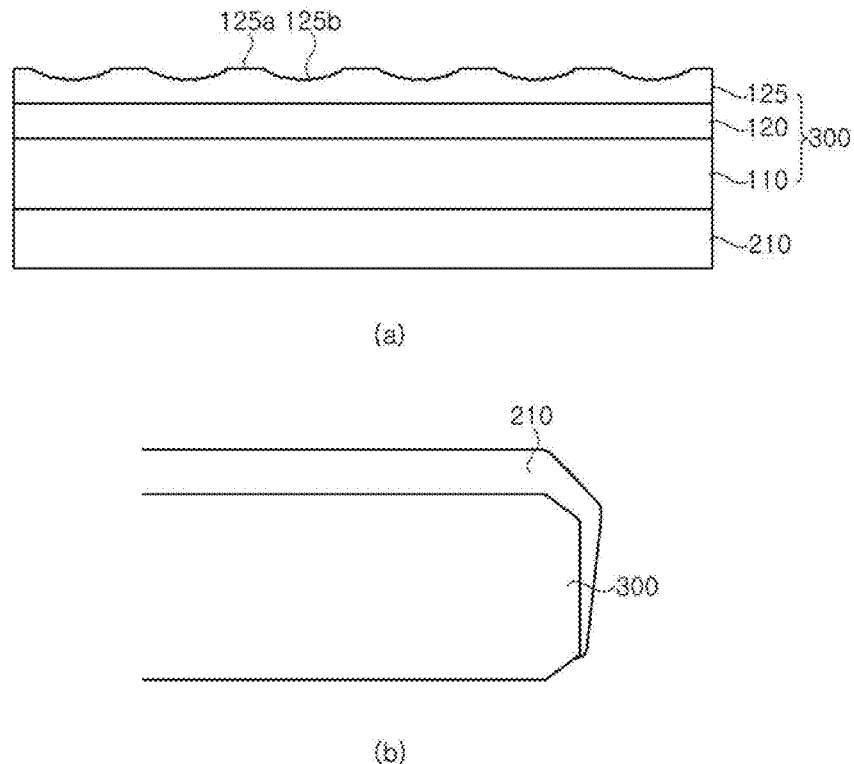
FIGS. 10a, 10b, 11, 12, and 13 are schematic sectional views illustrating a process of etching a surface of a substrate using electrochemical etching in accordance with an exemplary embodiment of the present disclosure.

Referring to FIGS. 9 and 10, a protective layer 210 is formed on the backside of the substrate 300 (S200). As shown in FIG. 10(a) and FIG. 10(b), the protective layer 210 may be formed not only on the backside of the substrate 300, but also on a side surface of the substrate 300. The protective layer 210 may be formed of $SiO_2$, Kapton tape, or thermal tape. $SiO_2$ may be deposited onto the backside of the substrate 300 using a deposition apparatus. Here, the side surface of the substrate 300 is exposed to allow $SiO_2$ particles to be deposited not only onto the backside of the substrate 300, but also onto the side surface of the substrate 300, whereby the side surface of the substrate 300 can be protected.

The $SiO_2$ layer was removed by etching in a NaOH solution, at a rate of about 600 Å for 30 minutes of etching and about 1000 Å for 1 hour of etching. Thus, the backside and the side surface of the substrate 300 can be protected by depositing $SiO_2$ to a thickness of about 1500 Å on the side surface of the substrate 300. Here, when the backside of the substrate 300 has a very high roughness, the $SiO_2$ layer may be formed to a thickness of 5000 Å or more. Although an upper limit of the $SiO_2$ layer is not particularly limited, the $SiO_2$ layer may be formed to a thickness of 5 μm or less, in consideration of processing time, material costs, and the like.

In the present exemplary embodiment, the substrate 300 may be a GaN substrate, and particularly, the backside of the substrate 300 may be an N-face. The N-face of GaN may be more likely to be damaged by electrochemical etching or chemical etching than a Ga-face. Accordingly, the protective layer 210 protects the N-face in the course of electrochemical etching or chemical etching by covering the N-face of the substrate 300.

Referring to FIGS. 9 and 11, the surface of the separated substrate 300 is etched by electrochemical etching (ECE) (S300). By electrochemical etching (ECE), fine voids 252 may be formed on an upper region of the substrate 300, for example, on the sacrificial layer 125. On the other hand, the etch-stop layer 120 prevents the fine voids 252 from being formed on a surface of the growth substrate 110.

For electrochemical etching (ECE), the separated substrate 300 and a cathode (for example, Pt electrode) are dipped in an ECE solution, and positive voltage is applied to the sacrificial layer 125, while applying negative voltage to the cathode. Here, the size of the fine voids 252 may be controlled by adjusting a molar concentration of the ECE solution, processing time, and applied voltage. The ECE solution may be an electrolyte solution including oxalic acid. For example, electrochemical etching may be performed using an oxalic acid solution while applying a voltage ranging from 20V to 60V. Electrochemical etching is performed at a relatively high voltage, and the protective layer 210 protects the side surface and the backside of the substrate 300 during electrochemical etching.

Referring to FIGS. 9 and 12, the surface of the separated substrate 300 is subjected to chemical etching (S400). By chemical etching, a portion of the substrate 300 which is electrochemically etched is removed, thereby providing a recycled substrate 400. In the present exemplary embodiment, the sacrificial layer 125 is removed by chemical etching, thereby providing the recycled substrate 400 on which the etch-stop layer 120a remains. The etch-stop layer 120a may be an etch-stop layer 120, a surface of which is partially removed by chemical etching. Higher resistance of etch-stop layer 120 to chemical etching ensures that the surface of the etch-stop layer 120 is prevented from being removed by etching.

Chemical etching may be performed using a solution containing, for example, NaOH or KOH. In addition, for efficient etching, the solution may be heated to a temperature of about 50° C. or more.

On the other hand, the protective layer 210 prevents the side surface and the backside of the substrate 300 from being removed by chemical etching.

Figure 13:
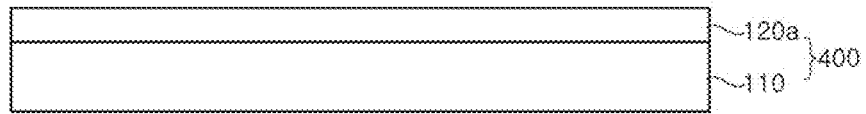

Referring to FIG. 9 and FIG. 13, next, the protective layer 210 is removed (S500). When the protective layer 210 is a $SiO_2$ layer, the protective layer 210 may be removed by buffered oxide etch (BOE). As a result, the recycled substrate 400 for growth of the gallium nitride-based epitaxial layer is completed.

A gallium nitride-based semiconductor layer may be grown on the recycled substrate 400. In addition, an undoped gallium nitride-based semiconductor layer may be further grown on the recycled substrate 400, and a sacrificial layer 125 of an n-type gallium nitride-based semiconductor layer is again grown thereon, followed by performing the processes as described with reference to FIG. 1 to FIG. 3, thereby providing a light emitting diode.

The substrate recycling method according to the exemplary embodiments of the present disclosure employs both electrochemical etching and chemical etching, thereby providing a recycled substrate comprising a relatively smooth surface. Further, in the substrate recycling method, there is no need for complete removal of the gallium nitride-based semiconductor layer grown on the growth substrate 110, and some of the gallium nitride-based semiconductor layer on the surface thereof is removed. Accordingly, as compared with typical substrate recycling methods in which the grown semiconductor layers are completely removed, the substrate recycling method according to the exemplary embodiments of the present disclosure provides improved material use efficiency and thus is suitable for substrate recycling.

Furthermore, since the backside and the side surface of the growth substrate 110 are protected by the protective layer 210, it is possible to prevent the backside or the side surface of the growth substrate 110 from being damaged in the course of electrochemical etching or chemical etching.

Exemplary embodiments of the present disclosure may provide a recycled substrate which has a smooth surface to be suitable for growth of a gallium nitride-based semiconductor layer. In addition, exemplary embodiments of the present disclosure may provide a recycled substrate which comprises an undoped gallium nitride-based semiconductor layer at an upper portion thereof.

Although the present disclosure has been illustrated with reference to some exemplary embodiments in conjunction with the drawings, it should be understood that some features of a certain exemplary embodiment may also be applied to other exemplary embodiments without departing from the spirit and scope of the invention. Further, it should be understood that these exemplary embodiments are provided by way of illustration only, and that various changes and modifications can be made without departing from the spirit and scope of the present disclosure.

What is claimed is:

1. A method of recycling a substrate, the method comprising:
   separating a first surface of a substrate from an epitaxial layer;
   forming a protective layer on an opposing second surface of the substrate;
   electrochemically etching the first surface of the substrate; and
   chemically etching the electrochemically etched first surface of the substrate.

2. The method of claim 1, wherein the protective layer comprises $SiO_2$.

3. The method of claim 2, wherein the protective layer comprises a thickness ranging from 5000 Å to 5 μm.

4. The method of claim 1, wherein the protective layer covers a side surface of the substrate.

5. The method of claim 1, wherein the substrate comprises a growth substrate and a sacrificial layer disposed on the growth substrate, the sacrificial layer forming the first surface of the substrate.

6. The method of claim 5, wherein the substrate further comprises an etch-stop layer disposed between the sacrificial layer and the growth substrate.

7. The method of claim 6, wherein the sacrificial layer comprises an n-type gallium nitride-based semiconductor layer, and the etch-stop layer comprises an undoped gallium nitride-based semiconductor layer.

8. The method of claim 7, wherein the chemical etching comprises removing the n-type gallium nitride-based semiconductor layer to expose the undoped gallium nitride-based semiconductor layer.

9. The method of claim 8, wherein the electrochemical etching comprises forming fine voids in the n-type gallium nitride-based semiconductor layer.

10. The method of claim 1, wherein the separated first surface of the substrate comprises protrusions and depressions, the protrusions having smoother surfaces than the depressions.

11. The method of claim 10, wherein the protrusions are disposed in a stripe pattern, an island pattern, or a mesh pattern.

12. The method of claim 1, wherein the substrate comprises a growth substrate comprising gallium nitride.

13. The method of claim 1, wherein the electrochemical etching is performed using an oxalic acid solution and by applying a voltage ranging from 20V to 60V.

14. The method of claim 13, wherein the chemical etching is performed using a solution comprising NaOH or KOH.

15. The method of claim 1, further comprising removing the protective layer after the chemical etching.

16. A method of recycling a substrate, the method comprising:
   forming a protective layer on a second surface of a substrate, the substrate comprising an n-type gallium nitride-based semiconductor layer disposed on an opposing first surface thereof;
   electrochemically etching the n-type gallium nitride-based semiconductor layer; and
   chemically etching the electrochemically etched n-type gallium nitride-based semiconductor layer.

17. The method of claim 16, wherein:
   the substrate further comprises an undoped gallium nitride-based semiconductor layer disposed between the n-type gallium nitride-based semiconductor layer and the second surface of the substrate; and
   the undoped gallium nitride-based semiconductor layer is exposed by the chemical etching.

18. The method of claim 16, wherein the protective layer covers a side surface of the substrate.

19. The method of claim 18, wherein the protective layer comprises $SiO_2$.

* * * * *